Aug. 31, 1965 R. C. P. HINTON ETAL 3,204,112

LOGIC CIRCUITS EMPLOYING NEGATIVE RESISTANCE ELEMENTS

Filed Aug. 18, 1960 2 Sheets-Sheet 1

INVENTORS.
RAYMOND C.P. HINTON
ERNEST H.P. BIGO
BY PETER PLESHKO

Robert Lieber
ATTORNEY

Aug. 31, 1965 R. C. P. HINTON ETAL 3,204,112

LOGIC CIRCUITS EMPLOYING NEGATIVE RESISTANCE ELEMENTS

Filed Aug. 18, 1960 2 Sheets-Sheet 2

INVENTORS.
RAYMOND C. P. HINTON
ERNEST H. P. BIGO
BY PETER PLESHKO

Robert Lieber
ATTORNEY 3,204,112

LOGIC CIRCUITS EMPLOYING NEGATIVE RESISTANCE ELEMENTS

Raymond C. P. Hinton, West Englewood, and Ernest H. P. Bigo, Nutley, N.J., and Peter Pleshko, Bronx, N.Y., assignors to International Telephone and Telegraph Corporation, Nutley, N.J., a corporation of Maryland Filed Aug. 18, 1960, Ser. No. 50,485
9 Claims. (Cl. 307—88.5)

This invention relates generally to logic circuits, such as "AND" and "OR" circuits, and to networks of such circuits, wherein elements having ranges of negative resistivity, as for example tunnel diodes, are employed as the basic circuit elements.

In a logic circuit unit employing such elements it is desirable to use a pair of the elements in a bistable series circuit arranged so that inverse changes in the impedances of the elements operate to produce large changes in the output signals of the logic circuit containing the pair, in transitions between the stable output conditions of the circuit. Such series pair arrangements have hitherto been operated as so-called "majority logic" circuits wherein signals of different polarity are required to flow in a plurality of input paths, the output signal being determined by the direction of flow of the majority of the input currents. The majority logic arrangement, however, introduces a design problem in connection with "sneak switching connections" which are set up through the input paths, and it therefore requires greater care and complexity in design and construction respectively.

Another disadvantage of such series pair arrangements concerns the stability of the unit containing the pair. It has been observed that the current in the circuit containing the series pair of tunnel diodes tends to oscillate during the rise time of an enabling signal, until the enabling signal has reached a predetermined level. This oscillation tends to render the final stable condition of the series pair uncertain.

A third difficulty associated particularly with logic circuits employing tunnel diode series pairs concerns the low impedance of the pair of tunnel diodes during the rise time of the applied enabling signal, and the resultant deterioration in the shape and amplitude of the enabling signal upon application to the pair. This tends to unduly limit the number of logic circuits which can be enabled from a single enabling signal source. Hence, such arrangements generally require a large number of driving circuits and also a large number of signal regenerating circuits.

Accordingly, it is an object of this invention to provide improved logic circuits.

It is another object of this invention to provide improved logic circuit units using pairs of tunnel diodes having one or more of the following advantages: greater stability, lessened possibility of "sneak" switching paths, and reduced enabling signal deforming characteristics.

In accordance with the foregoing objects, a feature of this invention resides in the provision of a logic circuit including a series pair of tunnel diodes separated by a constant series resistor having a uniquely determined value which ensures the stability of the diodes upon application of an enabling signal. The diodes are poled so as to provide series impedances which may be varied reciprocally between first and second pairs of stable impedance values as a unique logical function of a plurality of input signals which are applied to an input terminal connected to the series resistor. The circuit parameters are such that the diodes tend to assume a first stable condition, corresponding to the first pair of stable impedance values, in response to enabling potentials of proper magnitude applied across the entire series combination, in the absence of the required input signal magnitudes. However, if the input signals are of proper magnitude, the diodes assume the second stable condition that defined by the second pair of stable impedance values, upon application of the enabling signal. An output signal having the required separation between transitional output levels and the required transitional stability is thus available at an output terminal connected to the series resistor.

According to another feature of the invention, a time sequential logic network including a chain of logic circuits, each employing a series pair of tunnel diodes separated by the aforementioned unique resistors, is enabled in rapid time sequence through an enabling signal distributing delay chain having appropriately spaced "taps" coupled to the logic circuits in the desired sequence. The impedances of the segments of the delay chain, between the "taps," are selected in accordance with the unique value of the resistor between the series pair of tunnel diodes of each logic circuit, so as to maximally preserve the shape and amplitude of the enabling signal as it propagates through the chain. Proper segment impedances are obtained by arranging a continuous length of conductor on supporting boards assigned to each segment, so that the conductor cooperates inductively with the distributed capacitance within the segment and, where necessary, with lumped capacitors connected to predetermined points on the conductors within the segments, to provide the desired low impedance.

The foregoing and other objects and features of this invention will be more readily appreciated and understood from the following specification and claims, including the appended drawings, in which:

Figure 1:
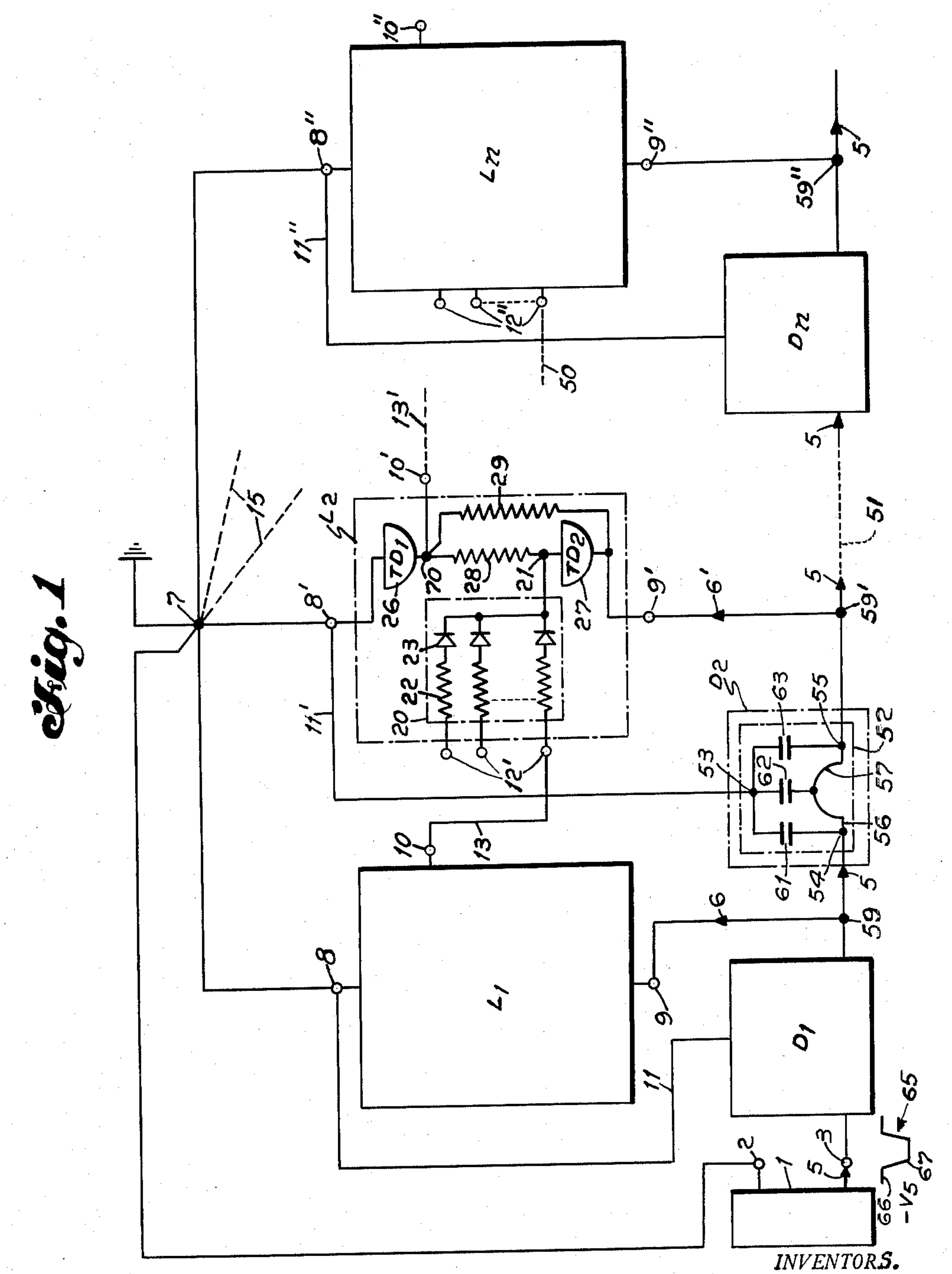
FIGURE 1 is a schematic drawing of a time sequential network of logic circuits including cascaded sections arranged in accordance with the teachings of this invention.

Referring to FIGURE 1, a network of time sequential logic circuits according to this invention, includes a plurality of basic logic circuits $L_1, L_2, \ldots L_n$, the dotted line serving to indicate that the integer $n$, is, in general, greater than 3. The same function is served by the dotted lines at 13′, 50, and 51, as will become clear hereinafter. The basic logic circuits are all generally identical, circuit $L_2$ being shown by way of example in greater detail, while the other logic circuits are indicated in block form. The circuits $L_1, L_2, \ldots L_n$, receive input signals at terminals indicated at 12, 12′ and 12″ respectively. Circuits $L_1$, $L_2$, and $L_n$ are respectively connected between pairs of terminals 8, 9; 8′, 9′ and 8″, 9″; across which are impressed enabling signals supplied from a single source 1, of enabling signals. Source 1, includes a pair of output leads connected to output terminals 2 and 3. Terminal 2 is connected, in common with the terminals 8, 8' and 8'' of the basic logic circuits, to a ground reference indicated diagrammatically at 7. The enabling signal appearing at output terminal 3 is a pulse variation 65, which is negative with respect to ground. The peak amplitude of this signal is $-V_s$ volts as indicated, in the vicinity of the transition region, by lines 66 and 67 at which the voltage levels 0 and $-V_s$ are respectively inscribed. The enabling signal at terminal 3 is conveyed in the required time sequence to the logic circuits by means of a delay line comprising a chain of delay segments $D_1, D_2, \ldots D_n$ which are respectively connected to logic circuits $L_1, L_2, \ldots L_n$, at the terminals 9, 9', . . . 9'', thereof. The propagation of enabling signals through the segments of the delay chain is indicated directionally by means of arrows 5, the dotted lines at 51 serving to indicate the permissible interposition of a plurality of delay segments not shown. The application of the signal emerging from each delay segment to the corresponding logic circuit is illustrated directionally by means of the arrows 6, 6', and 6''. Signals entering the delay units are referenced to ground by means of the ground connections 11, 11', and 11'' shown in FIGURE 1.

In accordance with the detailed illustration of logic circuit $L_2$, delay segment $D_2$ is also shown in detail, and is representative of the contents of the other delay segment blocks. As shown in the figure, delay segment $D_2$ includes a supporting member 52 to which are affixed three terminals designated 53, 54 and 55. Terminal 53 is connected to ground as shown and the other two terminals, 53 and 54, are interconnected by means of a conductor 56 which is curved, as at 57, to provide a desired amount of series inductance.

It should be appreciated that while a curved conductor is employed in the specific illustration to provide the required inductance in the delay segment, many other techniques are equally feasible, for example, a straight conductor passed through magnetic material of suitable reluctance characteristics may be used to provide the desired inductance.

Further, as shown in the figure, spaced points of the series inductor are coupled to ground terminal 53, through capacitors indicated at 61, 62, and 63. It is to be noted that the length of conductor 56 supported by the terminals 54 and 55 is very long in relation to the length of conductor connecting the output of the preceding segment $D_1$ to terminal 54. Similarly, within all of the other delay segments, the length of the mounted conductor is great in relation to that of the conductive connection between adjacent segments. The values of inductance and capacitance in segment $D_2$, and in the other segments are arranged so as to present a very low characteristic impedance to signals propagating through the delay chain. In the specific apparatus under consideration, the arrangement is such that the characteristic impedance of the delay chain is on the order of 10 ohms.

Accordingly, in operation, enabling signals issuing from source 1 emerge at terminal 3 and propagate sequentially through the reactive delay segments $D_1, D_2, \ldots D_n$. Referring to segment $D_2$ by way of example, the enabling signal appears first across terminals 53 and 54, and after a time determined by the square root of the product of the inductance and the capacitance within $D_2$, the signal appears across terminals 53 and 55. The last-mentioned pair of terminals are respectively connected to the terminals 8' and 9' through leads which, it is repeated, are understood to be short in relation to the length of conductor 56.

It should also at this time be appreciated that if the logic circuits provide impedances which are small in relation to the 10 ohm impedances of the delay segments, the amplitude of the propagating signal will be radically diminished and distorted as the signal progresses through the delay chain. Such diminution and distortion is intolerable in large-scale systems employing logic circuits of the subject type since, as will be more fully explained hereafter, in such circuits, the enabling signal is required to be of an amplitude within a narrow range of amplitudes and this amplitude range must be attained within a predetermined time following the energization of the preceding logic unit stage. Applicants herein have overcome the characteristic distortion associated with previously available units by an ingenious and unique modification of such units.

In order to understand the unusual modification provided herein, applicants' logic unit will now be described in connection with the specific embodiment shown at $L_2$. As indicated, the enabling signal is applied across the ground terminal 8' and terminal 9'. Between these terminals, the unit includes a series combination of elements 26, 27 and 28, elements 26 and 27 being separated by the element 28. Elements 26 and 27 are negative resistance elements, preferably tunnel diodes, and element 28 is a resistor which is uniquely determined within a narrow range of resistance values to provide the required transitional stability despite large variations in the impedance of the series tunnel diodes, and simultaneously to provide additional impedance to lessen the distortion of enabling signals, and other essential operating characteristics as described hereinafter. The circuit $L_2$ includes input and output terminals 21 and 10' respectively, which are affixed to opposite ends of the resistor 28 as shown. For convenience in future references tunnel diodes 26 and 27, are respectively designated $TD_1$ and $TD_2$.

Also within circuit $L_2$, the signals at input signal terminals 12' are coupled through coupling paths designated generally as a coupling block 20, to the input terminal 21 at the junction of resistor 28 and tunnnel diode $TD_2$. Within coupling member 20, each input path preferably includes a resistor 22 in series with an ordinary diode 23 between a corresponding one of the input signal terminals 12' and the input terminal 21.

Further, between the output terminal 10' and the enabling signal terminal 9', a shunt resistor 29 is connected for purposes to be described.

In order to understand the operation of this unit, it is desirable by way of contrast to provide a brief explanation of prior logic circuit arrangements utilizing series pairs of tunnel diodes without series resistors, such as the resistor 28. In such prior arrangements the paths of the input coupling member are generally low impedance connections which do not include diodes or other means for relative isolation between paths since each input path is required to optionally conduct current in opposite directions in accordance with the value of the input signal, and the resultant impedance condition of the tunnel diode arrangement depends on the direction of flow of the majority of the input currents. Such arrangements, generally known as majority logic arrangements, are characterized by the lack of isolation between inputs, and, when utilized in large scale switching complexes as, for example, in large scale digital computing apparatus and the like, they are susceptible of "sneak switching connections" which tend to produce erroneous output results. It is thus desirable to provide a logic circuit arrangement wherein all of the inputs are unilaterally directed so that greater isolation may be provided between input paths. However, because of the peculiar nature of such tunnel diode series pairs, and other logical circuits utilizing pairs of elements similar in operating characteristics to tunnel diodes, it is ordinarily not permissible to employ unidirectional inputs. This will be more clearly understood upon consideration of the operating characteristics of tunnel diodes as in FIGURE 2A, and also upon consideration of the operation of tunnel diode logic circuit $L_2$, in accordance with the curves presented in FIGURES 2A and 2B.

Figures 2A, 2B, 3, 4, 5, 6:
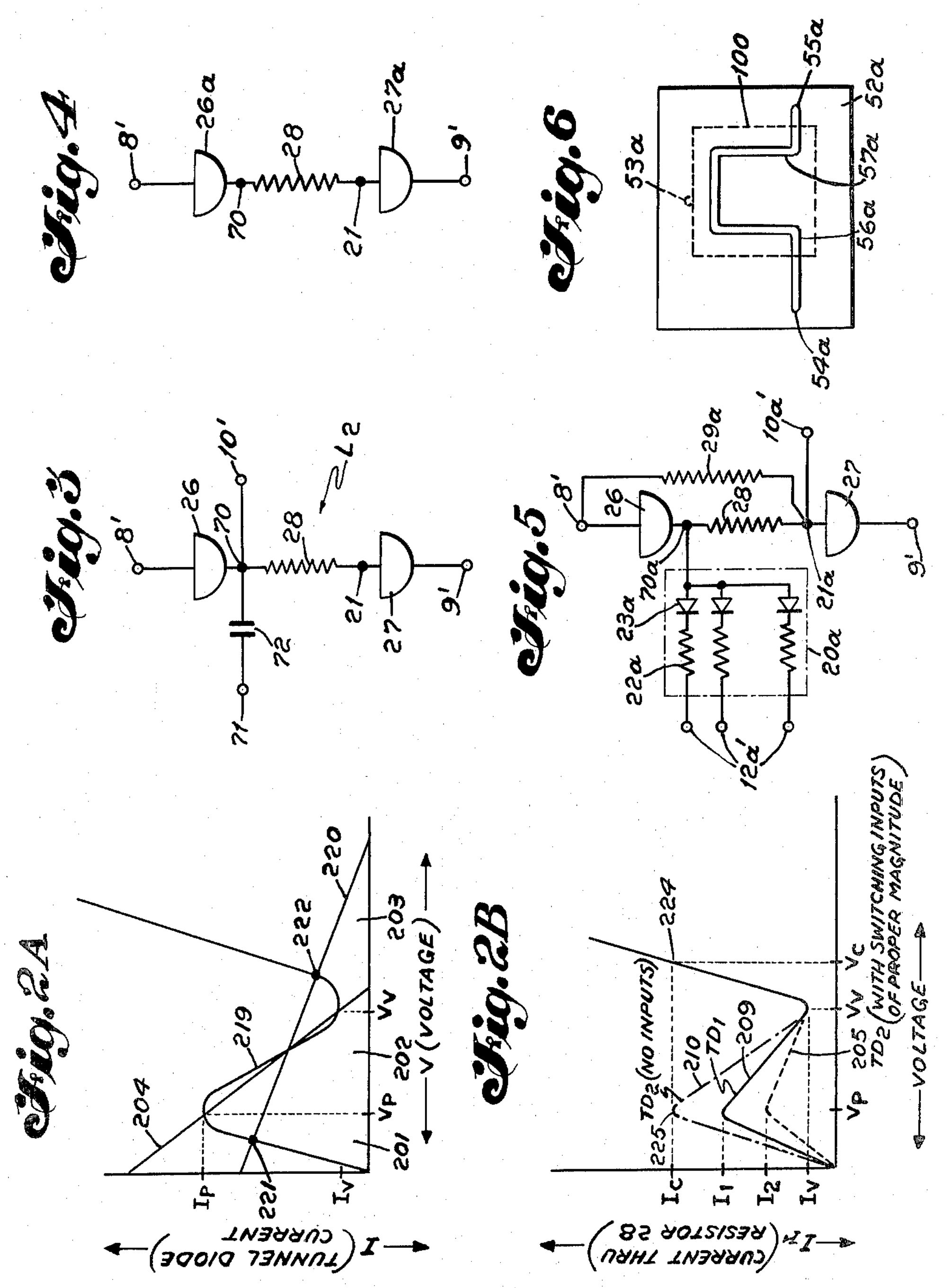
FIGURE 2A is a curve of the operating voltage current characteristics of a single tunnel diode.
FIGURE 2B is a curve illustrating the relative operating characteristics of the pairs of tunnel diodes employed in the basic logic circuits of FIGURE 1.
FIGURE 3 is a circuit diagram of a modified logic circuit according to this invention in which a preferential initial impedance condition is established by means of a capacitively coupled reset signal.
FIGURE 4 is a circuit diagram of another modified logic circuit according to this invention in which a preferential initial impedance condition is established by using tunnel diodes of different operating characteristics in each series pair.
FIGURE 5 is a circuit diagram of a modified logic circuit of this invention in which the preferential initial condition of the basic logic circuits of FIGURES 1, 3 and 4 is reversed.
FIGURE 6 is a drawing in elevation, with a portion of the underside illustrated by means of dotted lines, of a modified delay segment, for use in the delay chain of FIGURE 1, which sequentially distributes enabling signals to the logic circuits shown therein.

A tunnel diode is a broadband element exhibiting negative resistance over a portion of its operating curve, a typical operating curve being shown in FIGURE 2A. The negative resistance operation of the diode is realized, referring to the curve, in the region lying between the first peak point at which the voltages and current are respectively designated $V_p$ and $I_p$ (in accordance with the peak value of current at this point) and a second peak point at which the voltages and current are respectively designated $V_v$ and $I_v$ (in correspondence with the "valley" or minimal value of the current at this peak point). Accordingly, it is seen that upon application of an enabling potential, $V_s$ across a circuit including a tunnel diode as the voltage across the diode increases in value from $V_p$ to $V_v$, the current in the diode decreases and the resistance increases, by an amount determined by the negative slope of the curve in this region, from the low value of resistance at the peak voltage point, to a much higher value of resistance in the region of the valley voltage $V_v$. At the intersections 221 and 222, of load line 220, with the curve 219, in the positive resistance regions on either side of the negative resistance region, two stable points of operation are defined. The more horizontally inclined the load line, the more nearly equal are the currents associated with the stable operating points, while as the load line is rotated towards the vertical, the greater will be the differences between the currents which flow at the stable operating points. The greater this current difference, the more reliable will be the operation of the tunnel diode in logic circuits in which the stable operating points are used to convey binary valued logic signals. This is especially true where the input coupling paths include large valued resistors, as in the present invention, to increase the isolation between paths, since in such arrangements relatively large current changes are required in each input path to properly drive other logic circuit loads which terminate the path. It is therefore ideally most desirable for isolational purposes to operate the tunnel diode between stable points situated very close to the peak operating points determined at the voltages $V_p$ and $V_v$, as with load line 204, so as to provide the greatest transitional current variation. Hence, it is preferred that the enabling signal applied across the diode circuit be confined within a narrow voltage range centered at a voltage slightly greater than $V_v$ so that when the diode is operated at the high impedance stable point, minimum current flows through the diode, thus providing a maximum transitional current variation between stable conditions.

Emphasizing again that reciprocally varying series pairs of tunnel diodes are essential to increase the transitional output variation between stable impedance states, and thus to correspondingly increase the load driving capability of the circuit, it should be understood, from the curve and load line in FIGURE 2A, that resistance in series with the pair, is limited to an order of magnitude considerably less than the maximum impedance of the diodes, where such maximal capability is required. It is further emphasized from preceding discussions that maximum resistance in series with the pairs of diodes is required in order to preserve the shape and amplitude of enabling signals applied to the logic circuits through a delay segment chain, even where the delay segments have low characteristic impedances on the order of 10 ohms as in the subject apparatus. These seemingly contradictory requirements are resolved by an optimal compromise which is dictated by a third requirement. The third requirement, in review, concerns the fact that series pairs of tunnel diodes, because of the extremely rapid transitional variations of the diodes in the unstable negative resistance region, tend to oscillate while the enabling pulse is rising from an initial quiescent level towards the final peak amplitude, until the enabling pulse amplitude is at a level at which one of the diodes is situated in a high voltage, high impedance, stable operating condition associated with the region 203 of FIGURE 2A, and the other diode is in a low voltage, low impedance, stable state associated with the region 201 of FIGURE 2A. Because of these oscillations it is somewhat uncertain as to which diode will be in which state. Applicants have determined a constant resistance of carefully calculated value, which, when placed in series with the tunnel diode pair, will prevent such oscillations, and also provide sufficient resistance to limit power dissipation, decrease the distortion per segment of enabling signals propagating through a chain of delay segments, and yet not unduly detract from the load driving capabilities of the series diode pair. Still another bonus advantage is the freedom from "sneak" switching paths and concomitant unidirectional input isolation made possible by applicants' series resistor which limits current flow in the backward direction and also makes it permissible to use larger values of input coupling resistors, so that while diodes 23, as in FIGURE 1, are necessary for the low-valued resistors 22 and the particular tunnel diodes used, for tunnel diodes of suitable characteristics, larger valued resistors 22 and 28 may be utilized, in which case the diodes 23 are unnecessary.

The determination of the resistor 28 which, in turn, determines, to within limits the range of values of resistors 29 and 22, involves the following considerations in connection with FIGURE 2B.

FIGURE 2B includes three curves, designated 205, 209, and 210, which characterize the current flow through resistance 28 during operation of the tunnel diode pair under different input signal conditions. The dotted line curves 205 and 210, characterize the flow of current thru resistor 28, with respect to the voltage across tunnel diode $TD_2$, as $TD_2$ is operated over its entire operating range in the series pair arrangement $L_2$, with and without input signals of the required switching magnitude, respectively. The foregoing term "switching magnitude" is used to denote the input signal magnitude at which $TD_2$ will operate in the stable operating region adjacent the valley point while $TD_1$ remains operated at a stable point near the peak voltage $V_p$. Solid line curve 209 is characteristic of the flow of current thru resistor 28 relative to the voltage across $TD_1$ during operation of $TD_1$ over its entire range in the series pair arrangement. From the relative ordinate displacements of the curves, it is clear that $TD_1$ will be the first diode to enter the unstable negative resistance region in response to an applied enabling signal, when no inputs are applied to $TD_2$. More specifically with no inputs applied to $TD_2$, as the enabling signal is initiated across terminals 8' and 9' of FIGURE 1, the current in resistor 28 increases. When the current attains the magnitude $I_1$, $TD_1$ becomes an unstable negative resistance while $TD_2$ remains in a stable operating condition. On the other hand if the input currents to $TD_2$ are of proper magnitude, it follows that when the current thru resistor 28 reaches the amplitude $I_2$, $TD_2$ will become unstable while $TD_1$ remains in a stable operating condition.

From FIGURE 2B, considering the *rapid* operating characteristics of tunnel diodes in general, it may further be appreciated that when either diode assumes an unstable operating condition, if a voltage greater than or equal to the valley voltage $V_v$ is not then available across the series pair of diodes, the unstable diode will remain unstable and oscillations will insue. To a close approximation applicants have determined that to prevent such oscillations a resistance $r$ is required in series with the tunnel diode pair such that:

$$Ir+2V_p \cong V_v \quad (1)$$

where I is the current thru the series resistor, $r$ immediately prior to unstable operation of either tunnel diode. From FIGS. 1 and 2A it should be clear that to a very close approximation $I=I_p$. With this series resistance, $r$ as the voltage across either diode approaches the peak voltage $V_p$, the voltage across the entire combination of series resistor and diodes approaches $V_v$, so that as either diode becomes unstable, and its resistance rapidly increases, a stable operating voltage $V_v$ will be immediately impressed across the unstable diode which will therefore be immediately operated into the stable operating condition associated with the valley voltage $V_v$, without intervening oscillations. Thus, selecting resistor 28 to have the value *r* determined from expression (1) above, the transitional stablity of circuit $L_2$ is ensured. Rewriting expression (1), $$r \cong \frac{V_v - 2V_p}{I_p} \quad (2)$$

It should be noted from expression (2) that the value of *r* is determined when the tunnel diodes are both in low impedance conditions just prior to the switching of one diode in response to the rising applied enabling signal. While this value of resistance *r*, has been found to be greater than the combined *low* series resistance of the diodes, it is considerably less than the value of coupling resistor 22 and also less than the stable high resistance of either diode. It follows that when $TD_1$ is in the high impedance stable condition, almost all of the enabling signal current will flow thru resistor 28 and very little will flow thru external loads connected to terminal 10′, providing that $TD_2$ is simultaneously in a low impedance stable condition. On the other hand, with the stable impedances of the tunnel diodes reversed, almost all of the current thru $TD_1$ is diverted to the external loads, while very little current flows thru resistor 28.

To ensure true reciprocal impedence operation of the diodes, the enabling voltage across the series circuit must never exceed the value $V_c$ indicated in FIGURE 2B. At this point, the current through resistor 28 is such that both tunnel diodes are operated through the unstable region to the right of $V_p$, as indicated by the intesections 224 and 225, of the constant current line $I_c$, corresponding to $V_c$, with the curves 209 and 210, respectively. It has thus been determined by applicants that the tolerances on the peak amplitude of the enabling signal and the restance, *r*, are such that the voltage across tunnel diode $TD_1$, when that diode traverses the unstable region, must never exceed $V_c$. For this purpose is has been found to be adequate to limit the enabling signal amplitude so that the high impedence voltage across $TD_1$ is in the range $V_v$ to $V_v$+20%. It has further been noted that when the high impedance signal voltage across $TD_1$ is decreased by approximately 20% from $V_v$, the logic circuit reverts to the condition where both diodes are low impedances or one is unstable. Thus, the above tolerance range is extended negatively from $V_v$ to $V_v$—20%, and the overall tolerance range of resistance *r* and the enabling signal amplitude are such that the high impedence voltage drop across the upper diode $TD_1$ is confined to the range $V_v$±20%.

In order to predetermine the preferential operating condition as in FIGURE 2*B*, of a pair of tunnel diodes having unidirectional inputs as in logic circuit $L_2$ of FIGURE 1, the resistor 29 may be used to introduce a difference into the initial currents drawn through the two diodes prior to initiation of the enabling signal, so that the upper diode $TD_1$ preferentially tends to traverse the unstable operating region and assume the high impedance, low current, condition associated with the valley voltage $V_v$, before the diode $TD_2$ can enter the unstable region.

For the particular tunnel diodes used, the General Electric Company GE IN2939 tunnel diode, the approximate corresponding numerical values of the peak voltage, valley voltage, tunnel diode low stable resistance, and *r*, are respectively 55 millivolts, 350 millivolts, 50 ohms, and 220 ohms. Further with the above values, the high value of stable diode resistance associated with the valley voltage condition is on the order of 3000 ohms for each diode. Suitable values for resistor 29 and coupling resistors 22 are 4700 and 1200 ohms, respectively, for the particular tunnel diodes used.

It is now clear that the series pairs of tunnel diodes provide reciprocal impedance variations between two stable operating pairs of resistance values, and that they are, therefore, useful for representing binary valued signals. It is further to be noted that the stable current levels at the output of the logic circuit units are widely separated despite the series resistance 28, thereby, insuring a high ratio between intentional, or intelligence, signal variations and random disturbances.

Where the inputs are to operate in unison to provide and AND function, with the lower tunnel diode $TD_2$ operated to the high impedance state when the coincidence condition is satisfied and the enabling signal is coincidentally applied, the input circuits are arranged so that all of the currents supplied through the terminals 12′ combine additively to produce a current which is uniquely sufficient to cause tunnel diode $TD_2$ to enter its unstable operating region in advance of $TD_1$. Note for example the interconnection 13 between the output 10 of logic circuit $L_1$ and the input coupling resistor 22 of $TD_2$ wherein it is seen that a fraction of the required current may for example be supplied by the preceding logic circuit $L_1$.

Similarly, an OR function may be provided by coupling some of the input terminals 12 to constant current sources, so as to pre-bias the tunnel diode $TD_2$ so that if any of the remaining inputs is positively energized, $TD_2$ will be conditioned to the high impedance state, while if none of the remaining inputs are so energized, $TD_1$ will assume the aforementioned high impedance state, and $TD_2$ will assume the low impedance stable condition.

It should also be noted that once tunnel diode $TD_2$ has assumed the high impedance state, and so long as the enabling signal is maintained at $V_s$, the conductive state of the tunnel diodes remains fixed independently of any variations in the input signal levels due to the reciprocal interaction of the diodes. It may therefore be appreciated that the logic circuit being described is also useful as a storage element wherein the duration of the enabling signal is determined by the period over which the storage function is required.

In order to reset the logic circuit after it has once been set to the condition where $TD_2$ is in the high impedance state, it is necessary to remove the enabling signal and thereafter reapply the enabling signal with new input conditions applied. Alternately, as shown in FIGURE 3, circuit $L_2$ may further include a coupling capacitor 72 connected between a reset signal terminal 71 and output terminal 10′ so as to capacitively couple a negative reset signal to terminal 71 having a duration and amplitude sufficient to permit the determination of the new input conditions.

Still another alternative is indicated in FIGURE 4 wherein the tunnel diodes 26 and 27 of FIGURE 3 are replaced by tunnel diode **26*a* and 27*a*, these diodes having characteristic relative operating curves, in accordance with FIGURE 2B, so arranged that in the absence of the required inputs, the upper diode 26*a* tends to enter the unstable negative resistance region before the lower diode 27*a* in response to an applied enabling signal, without the use of the shunt biasing resistor 29**, of FIGURE 1.

In connection with the foregoing, it should be noted that the resistor 28 determined in accordance with the expression (2), above, may either be a resistor which is electrically connected by means of solder, or otherwise, to the tunnel diode terminals, or the tunnel diode pair may be fabricated as a four terminal device including the terminals 8′, 70, 21, and 9′ with resistance properly interposed between the terminals by means of well known printed circuit techniques, or the like, and the entire assembly may be encapsulated as a unit, with the four terminals brought out through appropriate connecting leads.

Referring to FIGURE 5, it is noted that the unidirectional input currents supplied to the tunnel diode $TD_2$ in the preceding figures may be transferred in the opposite direction through the input coupling member and the conductive conditions of the tunnel diodes may be inverted by means of an oppositely poled set of input paths coupled to terminal 70a which then serves as the input terminal and the output may be conveniently taken from terminal 21 as shown, with the preferential conductive condition of the tunnel diode pair being established as the high impedance condition of the lower tunnel diode $TD_2$, by means of the operating point resistor 29a.

In connection with the foregoing description of the delay segment $D_2$, it should be understood that many modifications are permissible within the scope of the invention and one such modification particularly suitable for conducting high frequency signals, is illustratively shown in FIGURE 6 wherein the supporting member 52a is a dielectric medium supporting, on the uppermost side, a conductor 56a which is properly affixed to the dielectric 25a between the terminals 54a and 55a. To the underside of the dielectric, a metallic ground plane conductive section is attached as shown by the dotted lines 100, and the terminal 53a, also indicated by dotted lines, is connected between plane 100 and the common system ground as in the connection of terminal 53, in FIGURE 1.

While the input and output terminals of circuit $L_2$ in FIGURE 1 are shown connected to the ends of the resistor 28, it is not essential that they be so connected. That is, they may be connected to tapped intermediate points of resistor 28, with no effect on the characteristic operation of the circuit except that the input and output circuits are less isolated.

While I have described above the principles of my invention in connection with specific apparatus, it is to be clearly understood that this description is made only by way of example and not as a limitation to the scope of my invention as set forth in the objects thereof and in the accompanying claims.

We claim:

1. A logic circuit for performing unique logical operations on binary valued signals comprising a pair of terminals, a series combination connected between said pair of terminals, said series combination including a first tunnel diode, a second tunnel diode and a series resistor connected in series between said diodes, said resistor having an approximate value of $(V_v-2V_p)\div I_p$ ohms, where $V_v$ and $V_p$ are voltages which define the negative resistance operating characteristic of said tunnel diodes and $I_p$ is the current associated with $V_p$, a second resistor connected between the end of said series resistor connected to said first tunnel diode and said terminal of said pair of terminals which is connected to said second tunnel diode, an input terminal connected to said end of said resistor connected to said second tunnel diode means including a plurality of unidirectionally conductive elements for applying a corresponding plurality of input signals to said input terminal, an output terminal connected to said junction of said second resistor and said series resistor, a source of D.C. enabling pulses and means for applying said pulses to said pair of terminals.

2. A circuit according to claim 1 in which said enabling pulse applying means includes a segment of a delay chain, said segment comprising a supporting member having first, second and third terminals mounted thereon and a conductor of predetermined length and inductance also mounted thereon, said conductor being electrically connected to said second and third terminals, said means further including means for applying said enabling pulse across said first and second terminals, and means connecting said first and third terminals to said respective terminals of said pair of terminals.

3. A circuit according to claim 2 in which said delay segment further includes lumped capacitors each having first and second plates, said first plates being connected in common to said first terminal, said second plates being connected to said conductor at given spaced points thereof, said capacitances and said spaced points being arranged to provide a spatially variable impedance which substantially preserves the shape and amplitude of said enabling pulses propagating through said delay chain.

4. A switching system comprising a two-conductor transmission line having a low characteristic impedance; a series of gate circuits shunted across said transmission line at spaced points therealong; each said gate circuit including a pair of variable impedance elements connected in series circuit, which elements, in the absence of a signal on said line are both normally in a stable low impedance condition constituting a significant load on said line, and which elements, in response to an enabling signal of a given polarity and amplitude, transmitted via said line to the point of connection between said line and said gate circuit, rapidly assume a combined stable high impedance condition, constituting a relatively insignificant load on said line, in which the impedance of one of said elements remains unchanged in relation to the said normally low impedance condition thereof; and means coupled to said elements for conveying intelligence through said series of gate circuits, in association with the transmission of an enabling signal along said line, by selecting the said one of said elements in each said pair whose impedance is to remain unchanged, in accordance with a switching signal condition established at a predetermined time prior to the arrival of said transmitted enabling signal at said point of connection.

5. A system according to claim 4 wherein said variable impedance gate circuit elements are tunnel diodes and wherein each said gate circuit includes a predetermined resistor in series with said tunnel diodes for preventing unstable negative resistance operation of said diodes until the rise portion of each enabling signal passing said point of connection attains an amplitude exceeding the amplitude required for stable high impedance operation of said gate circuit.

6. A logic circuit unit for performing a single logical operation on binary-valued input signals, said unit comprising a series combination including first and second elements each having corresponding first and second electrodes and each exhibiting negative incremental resistance for a given range of voltages across said electrodes, said combination further including a substantially constant impedance element connected in series between said second electrode of one of said elements and said first electrode of the other of said elements, means for applying a voltage across said series combination to produce a unidirectional flow of current through said series combination, an input terminal coupled to said substantially constant impedance, an output terminal coupled to said substantially constant impedance, and means for simultaneously applying a plurality of input signals to said input terminal to vary reciprocally the relative conductivities of said elements as a logical function of said input signals, said substantially constant impedance element being a resistor having a value approximately equal to $$\frac{V_v-2V_p}{I_p}\text{ ohms}$$

where $V_v$ and $V_v$ are respectively voltage values which define the negative-incremental-resistance operating regions of said elements, and where $I_p$ is the current in amperes associated with $V_p$.

7. A logic circuit unit in accordance with claim 6 in which said input and output terminals respectively are connected to said substantially constant impedance element at spaced points thereof.

8. A logic circuit for performing a unique logical operation on binary-valued signals, said circuit comprising a source of direct current, a pair of terminals, means for applying said direct current to said pair of terminals, a series combination connected between said pair of terminals, said combination including first and second tunnel diodes and a substantially constant-valued resistor connected in series between said tunnel diodes, said resistor having input and output terminals connected thereto, said tunnel diodes being arranged in said circuit to provide impedances which vary reciprocally between first and second pairs of stable impedance values in response to signals applied to said input terminal in coincidence with the passage of said direct current from said source through said pair of terminals and said series combination, and means for simultaneously applying a plurality of signals to said input terminal to condition said tunnel diodes from said first to said second pair of stable impedance values as a unique logical function of said input signals, said resistor having an approximate resistance value of $$\frac{V_v - 2V_p}{I_p} \text{ ohms}$$

wherein $V_v$ and $V_p$ are respective voltage values defining the negative-incremental-resistance operating region of said tunnel diodes between the valley voltage point and the peak voltage point thereof, and wherein $I_p$ is the current in amperes associated with said peak voltage value $V_p$.

9. A logic circuit in accordance with claim 8 wherein said input and said output terminals are respectively connected to said resistor at the opposite ends thereof.

References Cited by the Examiner

UNITED STATES PATENTS

| | | | |
|---|---|---|---|
| 2,631,232 | 3/53 | Baracket | 328—130 |
| 2,939,002 | 5/60 | Guillon et al. | 328—130 |
| 3,027,464 | 3/62 | Kosonocky | 307—88.5 |
| 3,062,970 | 11/62 | Kam Li | 307—88.5 |

OTHER REFERENCES

Chow et al.: AIEE Conference Paper No. CP 60–297, "Tunnel Diode Circuit Aspects and Application," January, 1960.

Proceedings of the Eastern Joint Computer Conference, Negative-Resistance Elements as Digital Computer Components, by Levin, Dec. 3, 1959.

Resigning With Tunnel Diodes, by Davidsohn et al., reprint from February 3 and 7, 1960, issues of Electronic Design.

ARTHUR GAUSS, *Primary Examiner.*

HERMAN K. SAALBACH, GEORGE N. WESTBY, *Examiners.*